US008878421B2

(12) United States Patent
Kuisma et al.

(10) Patent No.: US 8,878,421 B2
(45) Date of Patent: Nov. 4, 2014

(54) ENERGY HARVESTING/TIRE PRESSURE, TEMPERATURE AND TIRE DATA TRANSMITTER

(75) Inventors: Heikki Kuisma, Helsinki (FI); Katsutoshi Narita, Miyoshi (JP)

(73) Assignees: Toyota Jidosha Kabushiki Kaisha, Toyota-shi (JP); Murata Electronics Oy, Vantaa (FI)

( * ) Notice: Subject to any disclaimer, the term of this patent is extended or adjusted under 35 U.S.C. 154(b) by 387 days.

(21) Appl. No.: 13/167,193

(22) Filed: Jun. 23, 2011

(65) Prior Publication Data

US 2012/0326565 A1 Dec. 27, 2012

(51) Int. Cl.
*H02N 2/18* (2006.01)
*B60C 23/04* (2006.01)

(52) U.S. Cl.
CPC ............ *H02N 2/18* (2013.01); *B60C 23/041* (2013.01); *B60C 23/0411* (2013.01)
USPC ............................ 310/339; 310/319; 310/329

(58) Field of Classification Search
USPC .......................................... 310/339, 319, 329
See application file for complete search history.

(56) References Cited

U.S. PATENT DOCUMENTS

| 6,062,072 | A | 5/2000 | Mock et al. | |
|---|---|---|---|---|
| 7,504,764 | B2 * | 3/2009 | Chang et al. | 310/339 |
| 7,605,482 | B2 * | 10/2009 | Brown et al. | 290/1 R |
| 7,631,554 | B2 * | 12/2009 | Behrends et al. | 73/146.5 |
| 2008/0164701 | A1 * | 7/2008 | Brown et al. | 290/1 E |
| 2008/0164702 | A1 | 7/2008 | Brown et al. | |
| 2008/0217926 | A1 * | 9/2008 | Lemieux | 290/1 R |
| 2009/0121493 | A1 | 5/2009 | Lemieux | |
| 2009/0121494 | A1 | 5/2009 | Lemieux | |
| 2009/0152990 | A1 | 6/2009 | Brown et al. | |
| 2009/0211353 | A1 | 8/2009 | Gao et al. | |
| 2010/0164705 | A1 * | 7/2010 | Blanchard | 340/442 |

FOREIGN PATENT DOCUMENTS

| GB | 2459685 A | 11/2009 |
|---|---|---|
| JP | 2005-57982 | 3/2005 |
| WO | 2008/079321 | 7/2008 |
| WO | WO 2010/042601 A1 | 4/2010 |
| WO | 2010/128864 | 11/2010 |
| WO | 2011/042611 | 4/2011 |

OTHER PUBLICATIONS

International Search Report issued Dec. 19, 2011 in patent application No. PCT/FI2011/050769 filed Sep. 7, 2011.
Search Report issued Aug. 23, 2013 in Singaporean Application No. 201301512-8.
Office Action issued Jul. 25, 2014, in European Patent Application No. 11823120.8.

* cited by examiner

*Primary Examiner* — Derek Rosenau
*Assistant Examiner* — Bryan Gordon
(74) *Attorney, Agent, or Firm* — Oblon, Spivak, McClelland, Maier & Neustadt, L.L.P.

(57) ABSTRACT

The invention embodies a harvester (12) to convert energy from mechanical domain to electrical domain. The harvester comprises at least one inertial body (6), at least one beam (7, 9), a support (8) to said at least one beam (7, 9) and transducer means (10, 16), wherein said at least one beam (7, 9) configures the inertial body (6) into a pendulum structure being suspended from said support (8) so that the beam (7, 9) is allowed to bend according to the kinetic state changes of the inertial body (6), and is configured to interact with at least one transducer means (10) that is/are configured to produce change in the electrical state of said transducer means (10, 16) responsively to the kinetic state of the beam (7, 9). The invention also shows harvester module, matrix and a harvester system comprising at least one embodied harvester. The invention also shows a tire and a foot wear that comprises at least one harvester embodied.

31 Claims, 8 Drawing Sheets

ENERGY HARVESTING/TIRE PRESSURE, TEMPERATURE AND TIRE DATA TRANSMITTER

In very general level the invention relates to conservation of energy in a closed system, but more particularly to harvesting energy in such a closed system as a tire structure. Even more specifically, harvester according to the invention relates to the field that has been indicated in the pre-amble part of an independent claim directed to thereof. The invention relates also to harvester matrix in the field that has been indicated in the pre-amble part of an independent claim directed to thereof. The invention relates also to harvester matrix system in the field that has been indicated in the pre-amble part of an independent claim directed to thereof. The invention relates also to harvester matrix module in the field that has been indicated in the pre-amble part of an independent claim directed to thereof. In addition, the invention relates also to tire in the field that has been indicated in the pre-amble part of an independent claim directed to thereof. In addition, the invention relates also to foot-ware in the field that has been indicated in the pre-amble part of an independent claim directed to thereof.

BACKGROUND

We live in the environment that comprises many kind of energies that flow out of the primary source in the use and may form a small flow as the main purpose of the energy used has been fulfilled, but there is still a residual or a secondary energy that has been still in the system present in a damped level or in another form.

Tire pressure measurement systems in automotive tires are common today. In a typical state of the art system a pressure and temperature sensor module is combined with a radio transmitter and assembled on the valve stem inside the tire. The electrical energy for the module is supplied by a battery. The energy available from the battery limits the signal transmission frequency and operating life of the module. The transmission frequency can be as low as once per minute. Also motion switches are in use to enable the transmission only when the tire is rotating at sufficiently high speed.

Alternative solutions have been proposed for the energy source. One solution is to supply the electrical energy to the module via electromagnetic fields. High frequency radio signals have been used as well as low frequency magnetic field coupling. Enough energy can be transmitted for update frequency up to once per second. Also no motion switch is needed. The disadvantage is the need for an antenna and associated cables in the vicinity of each tire. This has rendered the system too costly for practical implementation.

A third alternative state of the art solution is to generate the electrical energy from available mechanical, thermal, radiation or similar energy sources that may be present in the tire. A reliable source of mechanical energy is provided by the rotary motion of the tire. A great amount of energy is available as mechanical power compared to the 10 … 100 µW electrical power needed.

Also it is desirable to mount the measurement module on the inner liner of the tire since at this location a representative temperature reading can be obtained, not influenced by the brakes. Also, if the measurement module is combined with the tire and not the valve or rim, tire parameter information can be transmitted in addition to pressure and temperature readings.

However, if considering the connections to external energy sources, they are difficult to reliably implement, in a closed systems as tires. External energy sources have to be replaced and/or loaded to restore the functionality of the in-tire-system electronics, such as the measurement electronics and/or transmitters to collect, save and/or report wirelessly the measurement results. In such conditions of the system where external energy sources are—if not entirely impossible—but at least very difficult to apply, the internal energy source is wanted.

However, although energy is surrounding ourselves in the world in many ways, the utilization of such loose energy, which is sometimes referred as degenerated energy, is problematic, especially in such a closed system as rotatable tire interior. The amount of such energy is sufficient for many purposes of digital electronics, but the implementation for mining of the energy and/or the conversion the available energy to utilizable form has not been yet found, except very low-level energy yields to be gained according to the known techniques as such, so that the electronics involved in the tire structure may be not operable reliably.

General Description of Embodiments

These above referred problems of the prior art that relate to the harvesting of the energy are solved by the embodiments of the invention, if not totally, the embodiments provide at least mitigation in a new way.

Harvester according to the invention is characterized in that what has been indicated in the characterizing part of an independent claim directed to thereof.

Harvester matrix according to the invention is characterized in that what has been indicated in the characterizing part of an independent claim directed to thereof.

Harvester matrix system according to the invention is characterized in that what has been indicated in the characterizing part of an independent claim directed to thereof.

Harvester module according to the invention is characterized in that what has been indicated in the characterizing part of an independent claim directed to thereof.

Tire according to the invention is characterized in that what has been indicated in the characterizing part of an independent claim directed to thereof Foot-ware according to the invention is characterized in that what has been indicated in the characterizing part of an independent claim directed to thereof A harvester, according to an embodiment of the invention, to convert energy from mechanical domain to electrical domain, comprises
  at least one inertial body,
  at least one beam,
  a support to said at least one beam and
  transducer means,
wherein said at least one beam
  configures the inertial body into a pendulum structure being suspended from said support so that the beam is allowed to deform according to the kinetic state changes of the inertial body,
  is configured to interact with at least one transducer means that is/are configured to produce change in the electrical state of said transducer means responsively to the deformed state of the beam or kinetic state of the inertial body.

According to an embodiment of the invention the harvester comprises according to an embodiment of the invention a torsion pendulum structure with at least one beam for the torsion deform.

According to an embodiment of the invention the harvester according to an embodiment of the invention comprises two beams configured to form the torsion axis through their intermediate inertial body, each beam being suspended to the supported at its own opposite side.

According to an embodiment of the invention, in the harvester according to an embodiment of the invention, the inertial body has at least three dimensions of which a length dimension in the pendulum plane is aligned perpendicular to the rotary axis in the pendulum plane of the movement.

According to an embodiment of the invention the harvester according to an embodiment of the invention comprises a beam that is configured to act as a spring in the pendulum structure. According to an embodiment the spring is configured to deform. According to an embodiment deformation is bending. According to an embodiment deformation comprises torsion. According to an embodiment the deformation comprises torsion bending and/or twisting According to an embodiment of the invention, the harvester according to an embodiment of the invention, comprising an inertial body and a beam, is configured so that the length dimension of the inertial body is long when compared to the length dimension of the beam, i.e. said inertial-body length being at least 1.5 times the length of the beam, the length of whose as measured between the suspension point to the support and to the inertial body.

According to an embodiment of the invention the harvester according to an embodiment of the invention is configured so that the length dimension of the beam is short when compared to the length dimension of the inertial body, i.e. said length being at most 0.66 times the length of the inertial body, said length as measured between the suspension point to the support and to the inertial body. According to a variant of embodiment, said length of the inertial body and that of the beam the respective length ratio is in the regime between the short and long as embodied.

According to a non-symmetric embodiment, the inertial body dimension can be different to a first end of the inertial body than to a second end of the inertial body as measured form a certain beam attachment spot to the inertial body. This way it is possible to influence on the ratio of amplitudes of the vibrations.

According to an embodiment of the invention the harvester according to an embodiment of the invention is configured so that the support comprises leading configuration to lead electricity through a layer of the support.

According to an embodiment of the invention, in the harvester according to an embodiment of the invention said leading configuration to lead electricity through a layer of the support comprises a galvanic lead through the support and/or a capacitor, whose at least one electrode is connected to the transducer.

According to an embodiment of the invention the harvester according to an embodiment of the invention further comprises at least one of the following:
  module housing,
  attachment means to translatory means,
  at least one overload stopper,
  at least one overload stopper integrated to the inertial body,
  an overload stopper whose function is based on magnetic repulsion,
  contact electrode for galvanic contact,
  electrical component, a receiver and/or a transmitter circuit,
  rectifier circuit,
  filter circuit to stabilize the produced flow of electricity, and
  energy storage for the produced electricity.

According to an embodiment of the invention, in the harvester according to an embodiment of the invention said transducer comprises piezoelectric-element configured electrically responsive for bending of the beam.

According to an embodiment of the invention, in the harvester according to an embodiment of the invention the piezoelectric element comprises piezoelectric layer on at least one surface of the beam.

According to an embodiment of the invention, in the harvester according to an embodiment of the invention the beam can be lengthwise aligned in radial direction for mount into a tire.

According to an embodiment of the invention, in the harvester according to an embodiment of the invention, the beam as connected to the inertial body is configured to reside for a mount further away from the center of rotation of the tire than the end connected to the harvester support.

According to an embodiment of the invention, in the harvester according to an embodiment of the invention, the transducer means comprises at least one coil and at least one permanent magnet adapted for electromagnetic induction to occur when the distance and/or the angle between the magnet and the coil changes according to the inertial body movement in respect to the support.

According to an embodiment of the invention, in the harvester according to an embodiment of the invention, the transducer means comprises at least one coil in the inertial body and the support has at least one permanent magnet.

According to an embodiment of the invention, in the harvester according to an embodiment of the invention, the transducer means comprises at least one coil at the support and the inertial body has at least one permanent magnet.

A harvester matrix according to an embodiment of the invention, comprises at least one harvester according to an embodiment of the invention.

A harvester matrix system that comprises at least one harvester matrix according to an embodiment of the invention. According to an embodiment the harvester matrix system comprise a group of harvester matrixes and/or individual harvesters from which some first ones are for example differently oriented, sized in the mechanical dimension, sized in the terms of power, and/or operational functioning, i.e. torsion based and/or pendulum based.

A harvester module according to an embodiment of the invention, comprises in the module at least one harvester according to an embodiment of the invention, preferably configured for a mount into the structure of the translatory means.

According to an embodiment of the invention, in the harvester module according to an embodiment of the invention comprises attachment structure to the inner liner of a translatory means.

According to an embodiment of the invention, in the harvester module according to an embodiment of the invention said translatory means comprises a tire, wheel, conveyor belt or a foot-ware.

A tire according to an embodiment of the invention, comprises at least one harvester according to an embodiment.

According to an embodiment of the invention, the tire according to an embodiment of the invention comprises connecting means to connect harvester-connected transmitter to a metallic part of the tire to be used as an antenna.

A foot-ware according to an embodiment of the invention comprises harvester module according to an embodiment of the invention.

According to an embodiment of the invention, in the harvester according to an embodiment of the invention the inertial body has even mass distribution.

According to an embodiment of the invention the inertial body in the harvester according to an embodiment of the invention has length-wise taken more mass located at the ends than at the middle of the inertial body.

According to an embodiment of the invention the harvester according to an embodiment of the invention comprises a circuit configured to form a transceiver that is operable in accordance of impulse radio-standard.

According to an embodiment of the invention, the harvester according to an embodiment of the invention comprises at least one overload stopper piece that comprises a pair of magnets adapted for the stopping function via magnetic repulsion for avoidance of direct contact of the magnetic surfaces of the stopper.

According to an embodiment, mere temperature and/or pressure can be measured. However, according to another ensemble of embodiments, optionally or in addition to the mere pressure and/or temperature, also other quantities can be measured according to the respective embodiments by the tire sensor module: road contact area, friction, traction forces, tire deformation.

According to an embodiment of the invention, the tire according to an embodiment comprises a strain gauge in the tire structure to be operated and read conventionally as such, but in connection to the harvester module to be used as direct or indirect power source.

When a harvester module or an ensemble of them is used as indirect power source, then there is a storage such as a battery and/or a super capacitor arranged for storing the electricity and also for delivery in a sudden need that exceeds the capability of the harvester module production capability. In such embodiment the harvester is storing to the battery and/or super capacitor the electricity, when there is more electricity available than currently needed for the normal operation of the embodiment in question.

According to an embodiment of the invention, in the harvester according to an embodiment of the invention at least one overload stopper is on the inertial body.

The word "comprise", also in the deflected forms, has been used as open expression within the embodiments of the invention. The word "configure" has been used as an expression to express a structural feature in the mechanical and/or electrical entity for the embodiments in suitable part.

The embodiments of the invention are combinable in suitable part.

FIGURES

In the following, examples are given and the embodiments of the invention are illustrated in more detail with a reference to the accompanying figures that are attached to the part of the description. The examples on objects indicated in the figures are not necessarily in scale to each other for the dimensions to the items and/or parts shown in the same or other figures. In the figures, same reference numerals are used to refer the same kind of objects, which are not necessarily actually the same. However the potential difference is clear to a skilled man in the art according to the embodiment and the shown context.

AN ENSEMBLE OF EXAMPLES ON ENSEMBLE OF EMBODIMENTS

Tire as Energy Source

Figure 1:
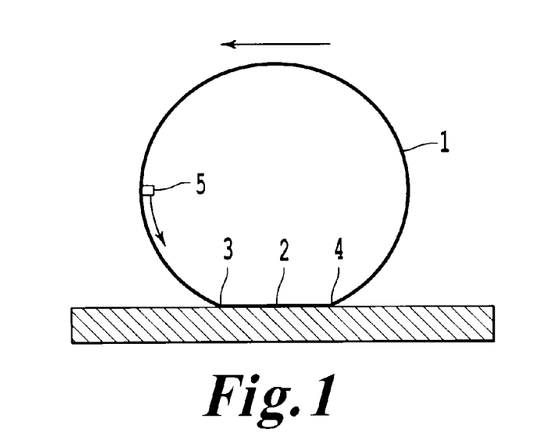
FIG. 1 illustrates a tire in duty and the transition location for the shape morphosis areas.

It is noticed that the angular motion can be used to excite an inertial system at the transition points of the shape of the tire (FIG. 1, points 3 and 4). The morphosis of the tire from round to flat (3) restores mechanical energy into the tire structure to be released when the tire form restores back (4) to the original round. It is further noticed, that as the energy level is sufficient for maintaining a measurement device and a small radio transmitter and/or receiver, harvester that uses the embodied inertial structure according to the invention actually solves the energy generation problem for the electronics in such a closed system as tire.

It is believed that it is not possible to harvest energy out of a wheel rotating at constant angular velocity without any external additional effects. The presence of earth's gravity enables harvesting of the tire structure restored energy, but to obtain high power levels a fairly large inertial body is required. Effect of the Earths gravity is seen as the sinusoidal baseline variation in FIG. 2. and FIG. 3.

Radical Accelerations

Figure 2:
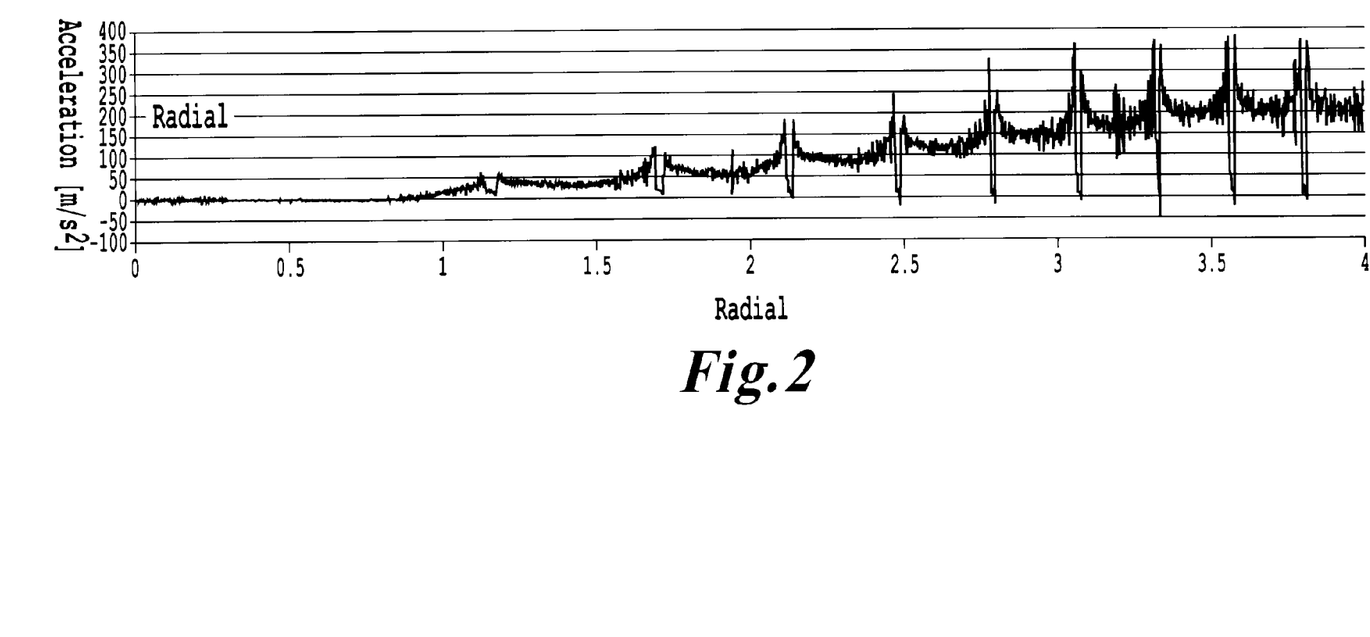
FIG. 2 illustrates experimental results on radial acceleration.

The tire offers acceleration levels that are much higher than earth's gravity. FIG. 1, shows a rubber tire in rotary motion. "Rubber" as such is mentioned and referred just an example of main constituent of a tire being used for simplicity in a non-restrictive manner, so not to get limited only to the mere embodiment where the rubber is the main constituent of the tire. According to an ensemble of embodiments, the tire can comprise other materials too, that are used in the known as such tires. The radial centripetal acceleration due to rotation is $$a = \omega^2 r \qquad (1)$$

where $\omega$ is the angular velocity of the tire and r is the radius. Skilled man in the art knows the nature of centripetal force, and, it is used here as its illustrative merits in the illustrations. This acceleration prevails at the location of the tire that is not in contact with the ground (1). During ground contact the tire is considered flat (2) (although a real tire may comprise such surface formations on the tire outer surface that may be not flattened at the flat area), the radius of curvature goes to infinity and the centripetal acceleration is zero. At the transition from flat to round portion (and back again) the radius of curvature is momentarily very small (3, 4) and thus there is a large peak of radial acceleration. This is seen in the FIG. 2, which is based on experimental data during acceleration from low speed to 50 km/h. An accelerometer (5) was mounted on the inner liner in the embodiment implementation study. In FIG. 2 the radial acceleration is given as a function of time (in seconds).

In reference [1] a energy harvester using the radial acceleration is presented. There the short flat period when no acceleration is present is used for harvesting. During the rest of the cycle the harvester may be easily overloaded by the centripetal acceleration if the harvester structure were not made very stiff with the expense of efficiency thus lost. Similar concept based on radial acceleration changes is presented in reference [2].

Tangential Accelerations

Figure 3:
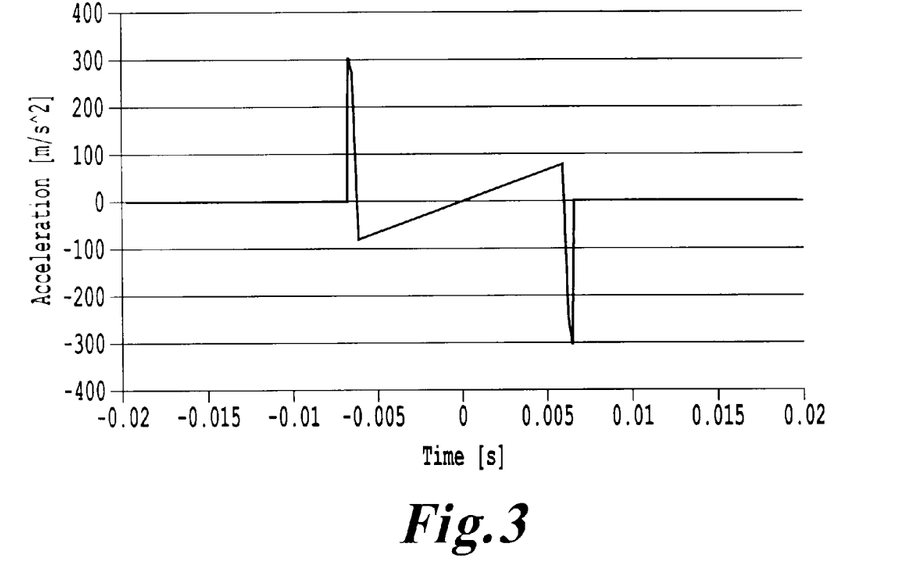
FIGS. 3 and 4 illustrate experimental results on tangential acceleration.

Due to the trajectory change of an object on the inner liner there is also a tangential acceleration component. The tangential velocity on the flat portion depends on the position and corresponding angle:

$$v(t) = v_0 \frac{\cos\left(\frac{v_0 t_0}{r}\right)}{\cos^2\left(\frac{v_0 t}{r}\right)} \quad (2)$$

where $v_0$ is the tangential velocity on the round portion, at the measurement location of the surface of the tire, r is the radius of the tire and $t_0$ is the time moment at point 4 of the FIG. 1. Time origin is selected in the example at the mid of the flat portion. There is a sudden increase of velocity at point 3 and a decrease at point 4. FIG. 3 shows an example for the calculated acceleration based on equation (2) at $v_0$=30 km/h, r=0.3 m and $t_0$=6.3 ms.

Figure 4:
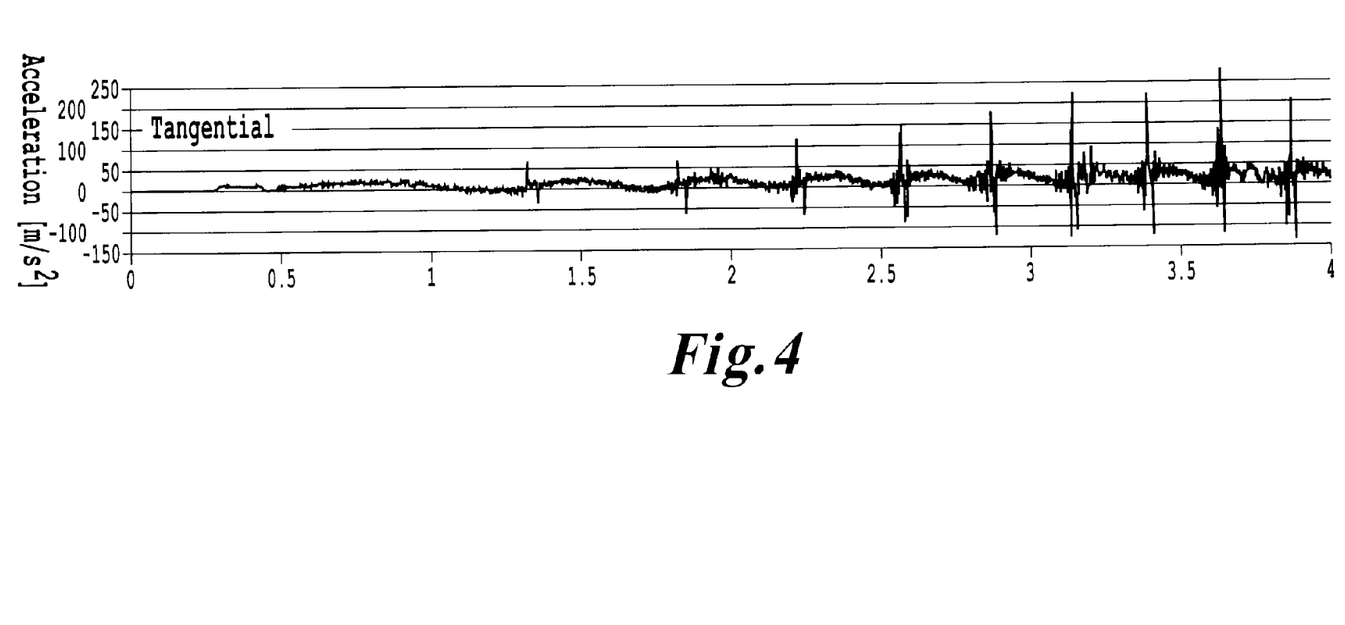

Examples on experimental result for tangential acceleration is shown in FIG. 4. Similar general behavior is seen as in FIG. 3 with a first positive and a second negative sharp acceleration peak.

Accordingly, the tangential acceleration can be used to excite an inertial system at the transition points.

Angular Motion

Figure 5:
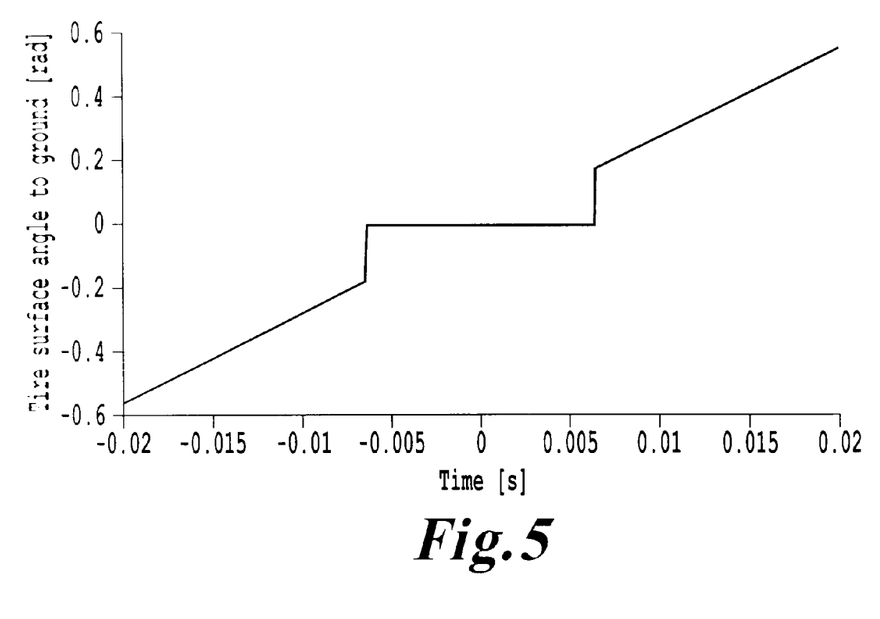
FIG. 5 shows tire surface angular angle as a function of time at the transition points in time domain.
Figure 6:
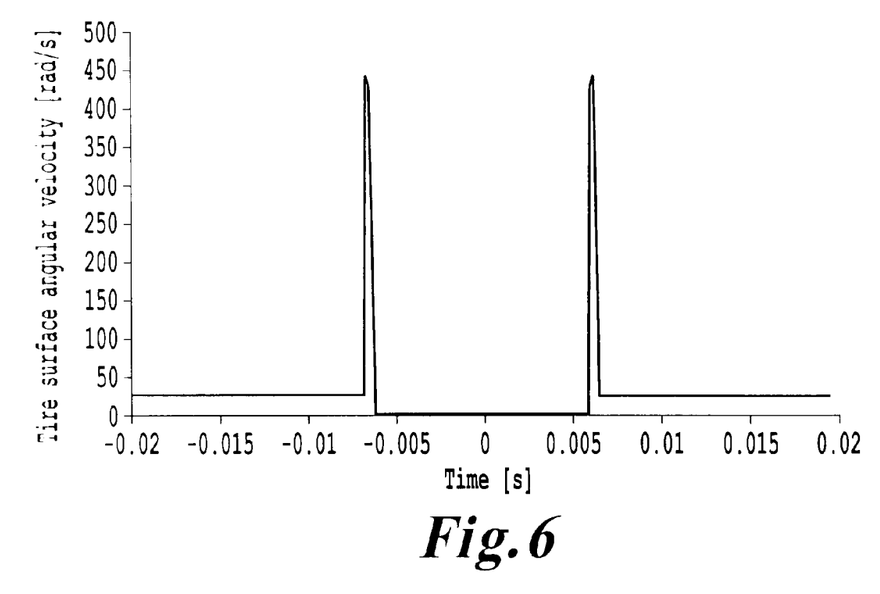
FIG. 6 shows angular velocity as a function of time at the transition points in time domain.
Figure 7:
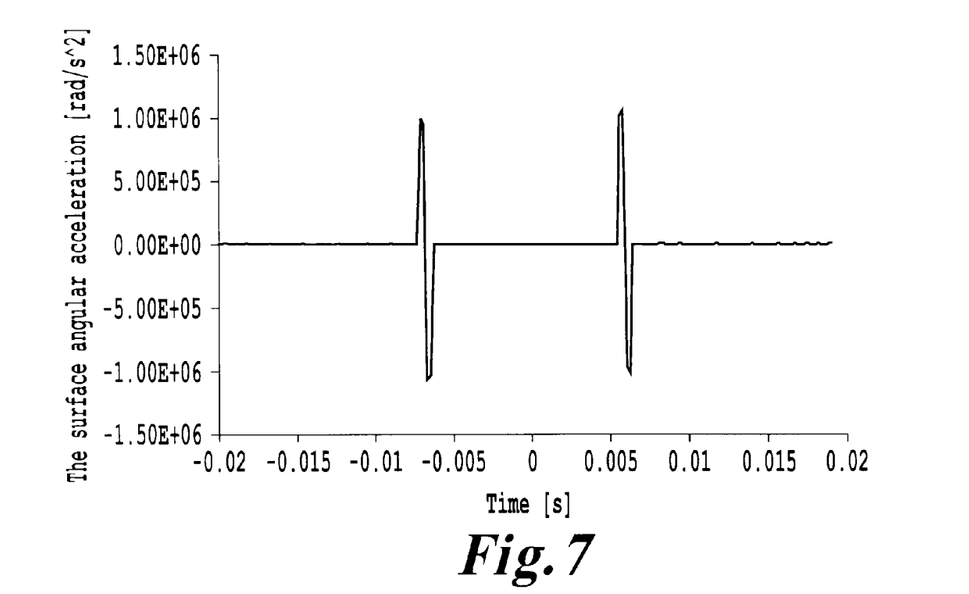
FIG. 7 shows tire surface angular acceleration as a function of time at the transition points in time domain.

The surface of the tire undergoes a very large angular motion during the transition from round to flat (3) and from flat to round (4) portions. FIG. 5 shows the angle as a function of time in the embodied example implementation. Angular velocity has large and narrow peaks at the transition points as shown in FIG. 6. Angular acceleration has double peaks at the transition points as shown in FIG. 7.

Embodiments of Inertial Energy Harvester for Angular Excitation

An Ensemble of Embodied Examples

In an ensemble of embodiment examples, an inertial system consists of an inertial body and a spring. The spring enables the inertial body to move in linear fashion or in angular fashion or in combination thereof these modes of movement are also denoted as deformations or mode of deformation. In the former case the mass of the inertial body and the linear spring constant determine the dynamic behavior and energy stored in the inertial system. In the latter case the moment of inertia- and the angular-spring constant determine the dynamic behavior and energy stored in the inertial system. This ensemble of embodiments of the invention relates to an energy harvester based on the inertial system with an inertial body possessing a moment of inertia and a spring allowing angular (or rotary) motion of the inertial body, which are also referred as pendulum (and/or a torsion pendulum) embodiments, respectively.

According to an embodiment of the invention, the transducer means 10 comprise a harvesting element 16. According to an embodiment the harvesting element comprises at least one of the following: a piezoelectric element that is suitable for bending, twisting or both, magnet, coil, and capacitor plate ensemble comprising at least one capacitor. According to an embodiment several harvester elements are used in the harvester structure. According to an embodiment, different harvester elements are used for a single harvester. This way, with several transducer means and/or different types of harvesting elements it is possible to make the harvesting in a redundant way operable and thus fatal faults for the operation can be limited.

Figure 8:
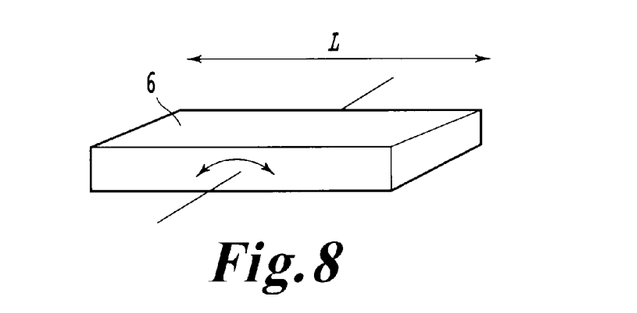
FIG. 8 illustrates an inertial body of an embodied harvester.

In an example on the inertial harvester in accordance of the embodiment of the invention, the inertial harvester responds to a sudden angular motion, such as present in an automotive tire at the points of transition (3, 4) from the round portion (3) to the flat portion (4) and vice versa. It is important to notice that the harvester exemplary embodied has the inertial body which has a substantial moment of inertia around axis of rotation of the tire. As an example, the moment of inertia of a rectangular cuboid is $$I = \frac{1}{12} mL^2 \quad (3)$$

where m is the mass of the body and L is the largest dimension of the body perpendicular to the axis of rotation. The inertia of a rotating inertial body can thus be increased efficiently by increasing the length and/or using uneven mass distribution, not only the mass. As an example there is an embodiment where the inertial body (6) has hammer-like L-shaped ends. FIG. 8 shows the axis of rotation and the length L of an inertial body 6 having shape of a rectangular cuboid. This kind of embodiment is later associated and referred to as torsion pendulum. Cupoid is used here for example because of simplicity reasons without any intention to limit embodiments only to that ensemble of embodiments that use cupoid shaped mass. It is also not intended to limit the inertial body have even mass distribution of the mass along the characteristic dimension L.

On an Ensemble of Embodiments Utilizing See-Saw Structure.

Figure 9A:
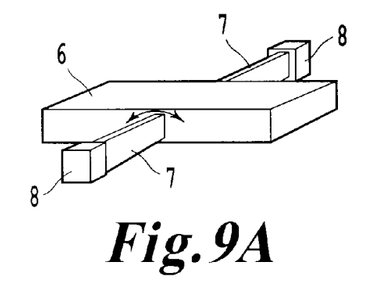
FIG. 9a to FIG. 9f illustrate embodiments of a torsion pendulum structure of the harvester according to an embodiment of the invention.
Figure 11:
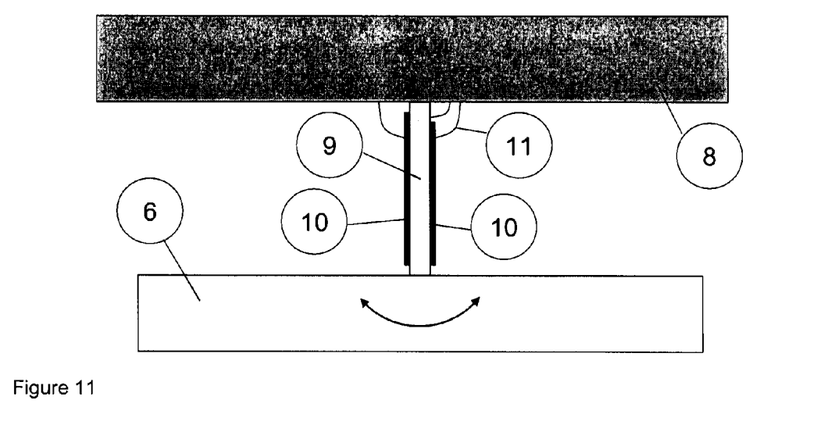
FIG. 11 illustrates a cross-section of the basic parts of an embodied piezoelectric harvester.

In FIG. 8 example on embodiments, the inertial body 6 can be suspended on the rotary axis by a pair of torsion springs 7 as shown in FIG. 9a. The outer end of the torsion springs are fixed to support structures 8 that connect the inertial body 6 and the system to the motion source, e.g. a tire. According to an embodiment it is also possible to implement a variant of mentioned torsion pendulum by a single suspension 7 to the support 8 too, in particular in such an embodiment that comprises the bending beam 7 in the pendulum, to utilize the connecting other, torsional, modes of oscillation to the pendulum embodiment when the inertial state of the inertial body 6 changes (FIG. 11). When the referred modes are to be used for signal formation and/or energy harvesting, it is advantageous to provide the torsion beam that operate as torsion spring with a sensitive transducer to transform the torsion spring energy to electric energy to be used for said purpose.

Figure 9B:
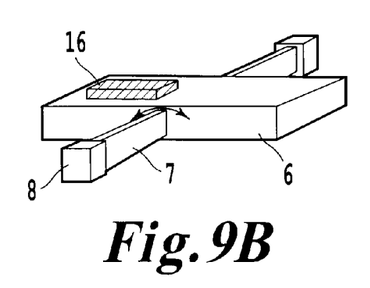

In FIG. 9b an energy harvesting element 16 converting kinetic energy of the inertial body to electrical energy is placed on the inertial body at a location of large displacement.

Harvesting element 16 as a transducer 10 may be based on capacitive, electromagnetic, piezoelectric or any other similar known method for conversion of energy from mechanical domain to electrical. Harvesting element 16 of FIG. 9b is a complete stand-alone harvester with no need of mechanical, magnetic or capacitive linkage to outside the inertial body.

Figure 9C:
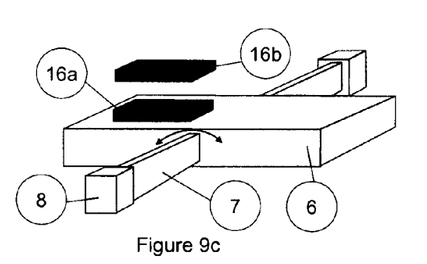

In FIG. 9c harvester part 16a on the inertial body is movable and in an embodiment needs an interaction with a fixed part 16b outside the inertial body. In the electromagnetic embodiment the movable harvester part 16a contains a permanent magnet and fixed part 16b contains a coil or vice versa: 16a contains a coil at the inertial body and part 16b a magnet 16b at a fixed location. In an electrostatic embodiment harvester part 16a at the inertial body is attached to a first electrode of the capacitor and the fixed part 16b of the harvester is attached to the second electrode of the electrostatic harvester.

Figure 9D:
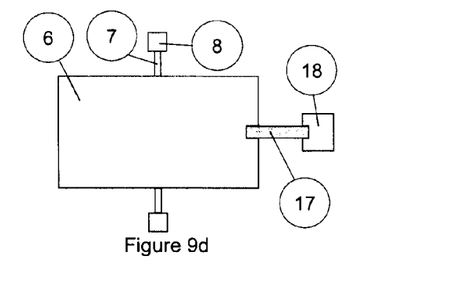
Figure 9E:
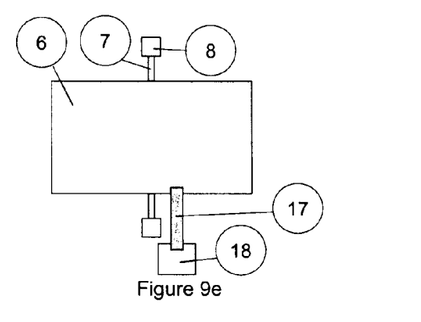
Figure 9F:
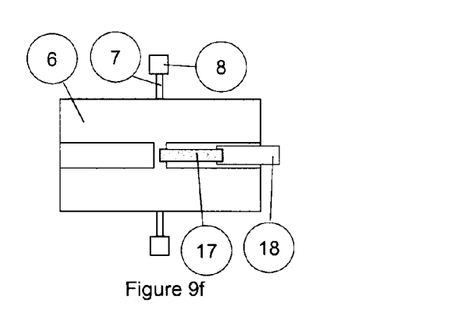

Torsion springs are suited for an energy harvester embodiments with such transducers that functions by capacitive and/or electromagnetic conversion of energy from mechanical domain to electrical. At the time of the priority date, torsion springs 7 are not suitable for placing piezoelectric material directly on them since the shear deformation of a torsion spring doesn't couple well to piezoelectric polarization. In a piezoelectric embodiment variant, additional piezoelectric element 17 has to be placed connected to the inertial body 6 and a fixed anchor 18. FIGS. 9d, 9e and 9f show possible placements of the piezoelectric element, but these are shown just as examples of numerous possibilities that a skilled man in the art can use when read and understood the outstanding embodiments of the invention.

On an Ensemble of Embodiments Utilizing T-Shaped Structure

Figure 10A:
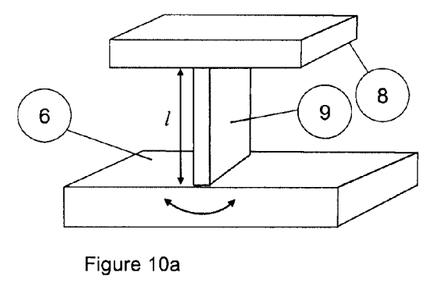
FIG. 10a to FIG. 10f illustrate embodiments of a bending pendulum structure of the harvester according to an embodiment of the invention.

Besides torsion springs an inertial body can be suspended for rotary motion on a short cantilever beam. According to an embodiment, piezoelectric harvester that comprise a short cantilever beam springs are preferred because bending of a spring is easily coupled to piezoelectric generation. They don't produce a pure angular motion, however; there is a small linear displacement component present. But by selecting a long enough inertial body the angular component can be made to dominate. The use of a piezoelectric cantilever beam spring for angular motion is especially advantageous in an ensemble of embodiments since the strain of the piezoelectric layer on the spring will be constant as a function of the spring length due to bending by torque at the end of the spring and not by a force. FIG. 10a shows an example on such a structure with an inertial body 6, a short cantilever beam spring 9 and a support structure 8. In a normal state of the art on pendulums the structure comprises a joint that allows the movement back and forth for the stiff (non-pendable or essentially non-pendable) beam. Contrary to said state of the art, in the embodiments of the pendulum embodiments, and torsion pendulum embodiments in suitable part, the beam is about to bend and/or twist.

Figure 10B:
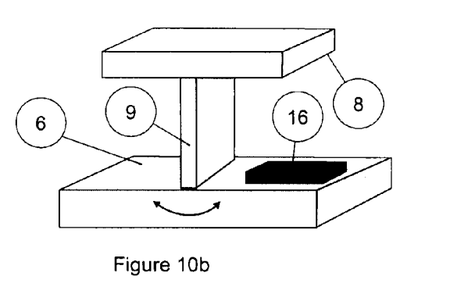

It is of course possible to place a stand-alone harvester or a group of such on the inertial body of this type of harvester similar to the inertial body supported by torsion springs (FIGS. 9b, 9c). An example for such embodiments is shown in FIG. 10b.

In an exemplary embodiment, the deflection of the cantilever beam, as a function of position from the end, which is connected to the inertial body is given by:

$$y = \frac{T}{2EI_B}(l^2 - x^2) + \frac{F}{3EI_B}(l^3 - x^3) \quad (4)$$

where T is the inertial torque by the inertial body, E is the Young's modulus, $I_B$ is the moment of inertia of the cross section of the spring, l is the length of the spring and F is the inertial force by the inertial body. The inertial torque is determined according to the shape and mass-distribution in accordance of the inertial body used in the particular embodiment.

Correspondingly, the angle of the cantilever beam is given by $$\theta = \frac{T}{EI_B}(l - x) + \frac{F}{2EI_B}(l^2 - x^2) \quad (5)$$

The bending moment of the spring is given by $$M = T + Fx \quad (6)$$

The strain at the surface of the spring is $$\varepsilon = \frac{Mh}{2I_BE} = \frac{h}{2I_BE}(T + Fx) \quad (7)$$

where h is the thickness of the spring. From (7) it is obvious from the exemplified embodiment shown, that a uniform strain along the length of the beam is produced if T is much larger than F*l (i.e. if x=l). This is advantageous for a piezoelectric transducer because charge generation will be uniform and there are no passive areas that would capacitively load the charge generating active area. The cantilever beam is used here as an example, but without any intention to limit the scope of embodiments only to the cantilever beam related embodiment.

Figures 10C, 10D:
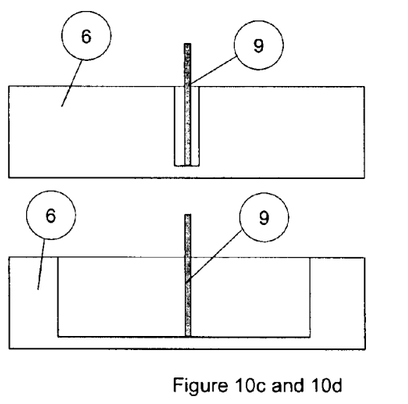
Figures 10E, 10F:
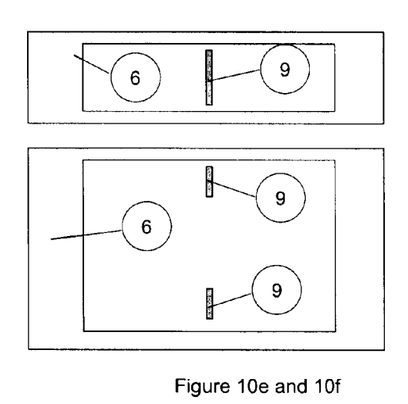

According to an embodiment, the cantilever beam spring 9 can be located in a recess of the inertial body 6 as shown in FIG. 10c (above). The inertial body may be partly hollow since for large moment of inertia and low mass the mass distribution predominately close to the ends of the inertial body is favorable (shown in FIG. 10d (below)). FIGS. 10e (above) and 10f (below) show top views of the inertial body and spring for corresponding embodiments. According to an embodiment of the invention, there may be merely one spring as in FIG. 10e or at least two springs as in FIG. 10f so even more as may be advantageous for improved strength in the application.

FIGS. 10c and 10d show examples on uneven mass distribution of the inertial body. In an embodiment, a part of the spring 7, 9 may reside in a recess of the inertial body.

According to a further variant of an embodiment the mass distribution is made such that the mass concentrates at the outer ends of the body. According to the shown examples on embodiments the mass distribution is symmetric in respect to the spring location at the center of the inertial body. However, it is not intended to limit the scope of embodiments only to the symmetric mass distributions. According to an further variant of embodiment, the inertial body may comprise uneven appearance, but the moments at the ends can still be balanced when using different materials and/or amounts thereof at the opposite branches of the inertial body formation.

FIGS. 10e and/or 10f illustrate a top view of a boat-like inertial body 6 with recess at the center of the inertial body. Some embodiments are not necessarily limited only to such recess type, form and/or recess number, which can vary according from an embodiment to another. The bending beam position at the center of the boat is shown, not necessarily limiting the scope of embodiments only thereto. The shape of the bending beam in FIGS. 10e and/or 10f is configured so that the beam 7, 9 is stiff at the sideways of the boat, but easily bend in lengthwise way.

FIGS. 10e and/or 10f show also an embodiment in which two or more bending beams 7,9 are used to make the harvester more robust for side-way impacts without making the spring too wide and also so stiff in the lengthwise direction because of the materials. The beams 7,9 are placed in line in the view of FIGS. 10e and/or 10f, so that there would be essentially no twisting moment to diagonal direction of the rectangular boat-like structure. But in embodiments where such modes were desirable, it can be implemented by non-aligned beams, preferably capable to tolerate at least some torsion present in the embodiment so implemented.

The stoppers and/or movement delimiters are not shown on the inertial body FIGS. 10a to 10f although can be used therein according to an embodiment.

FIG. 11 shows an example of a cross-section of the basic parts of an embodied piezoelectric harvester. The inertial body 6 is suspended on cantilever beam spring 9. To the beam a piezoelectric transducer 10 is attached on one (unimorph) or both sides (bimorph). In an embodiment of the invention where a triangular shaped beam spring is used, each side (multimorph) of the beam spring can comprise a transducer, to be used for the motion mode energy harvesting, for signal formation and/or energy conversion for direct use and/or storing. The transducer is electrically connected to electrical circuits on the support structure 8 by electrical connection means 11. The electrical connection means may be soldered wires, bonded wires, direct solder attachment, conducting adhesive or similar. According to an embodiment of the invention in some cases also induction and/or capacitive connection can be used for the electrical energy transference to the circuits in use.

Figure 12:
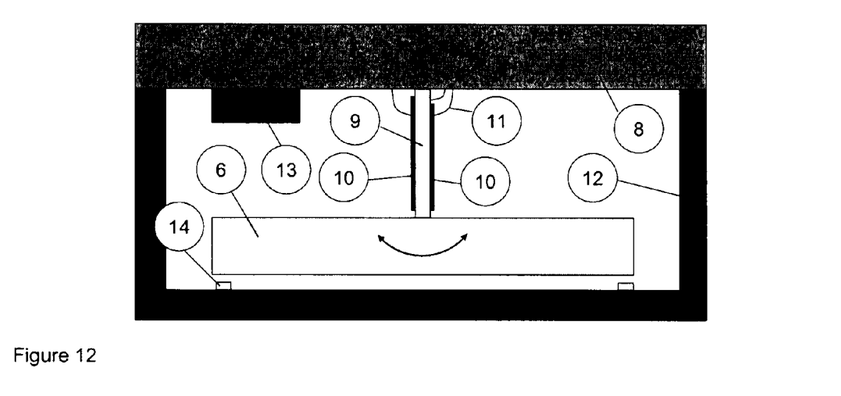
FIG. 12 illustrates an embodiment of the invention in a harvester module.

A complete harvesting device is shown in FIG. 12. Complete, being used in the meaning to understand the operation of the harvester according to the examples shown. Based on the embodiments, and because of the skilledness of skilled person in the art, skilled person can provide the tire and/or the harvester and/or harvester module with the infrastructure from the previously known techniques that is not shown in the FIG. 12, but may be necessary for practical implementation in use for mere supporting functions. Thus the complete should be understood to denote to understanding of the operation principle to convert the energy to electrical domain for the use of the electronics involved and exemplified 13. The support structure 8 is embodied in the example as a printed circuit board. It is attached to a module housing 12. On the printed circuit board 8 electrical components 13 are attached. The electrical components in the embodied example are used for converting and/or stabilizing the harvester output voltage and for other functions the system is required to perform, e.g. pressure and temperature measurement and transmission by radio waves of the measurement results and tire information. Overload stoppers 14 are provided on the package or on the inertial body to protect the piezoelectric transducers from breakage at overload. In an embodiment at least some of the overload stoppers can be embodied as based on magnetic repulsion, and thus minimizing the stoppers to touch and wear out.

Figure 13:
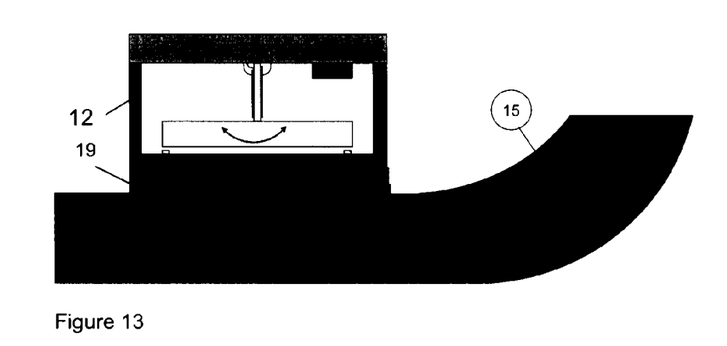
FIG. 13 illustrates an embodiment of the invention in a harvester module attached to a tire.

In an example, the harvester is in a harvester module that is mounted on the inner liner of a rubber tire 15 with the aid of a compliant layer 19. The cantilever beam 9 is aligned in radial direction in such manner that the end connected to the inertial body is further away from the center if rotation of the tire that the end connected to the harvester base (when the beam is in the rest position aligned with the gravitation field). This is to avoid compression of the spring by static centripetal acceleration and lowering of the resonance frequency and potential buckling of the spring.

According to an embodiment of the invention, strain gauges are included into the tire. This way and placing them into several areas of the tire, it is possible to indicate which part of the tire is in contact with the road. According to the embodiment, also the forces that are subjected to the strain gauge at the contact thus can be measured, and converted to electric signal.

Harvester Operation

A harvester according to an embodiment will operate as follows: when the harvester reaches the point of transition 3, 4 on the tire surface a rapid angular motion as shown in FIGS. 5 through 7 will excite the inertial system. If the resonant frequency of the system is low compared to the transition speed the excitation will be an amplitude excitation according to FIG. 5. If the resonance frequency is high compared to the transition speed the system will respond to the acceleration signal of FIG. 7. The excitation angular amplitude of FIG. 5 will be around 0.2 radians, which is much too high for bending of any piezoelectric element of practical length, at the priority date of the application. The overload stoppers will therefore limit the motion to e.g. 0.05 rad in the example. However, also larger values are possible, when the materials develop accordingly.

Figure 14:
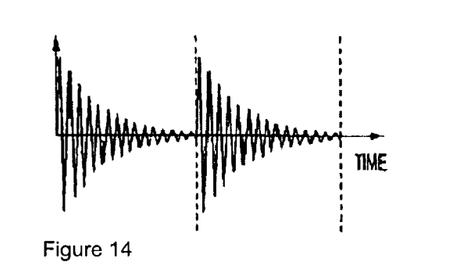
FIG. 14 illustrates in an embodiment the decay of the vibrations of inertial body and a new excitation.

After the transition of the tire and during the energy conversion the mechanical energy of the inertial system will oscillate between the potential energy of the spring and the kinetic energy of the inertial body at the resonant frequency of the system. Continuously during the vibration of the harvester, electrical energy generated by the harvesting element is transferred from the harvesting element to an electrical load. The load may comprise electronic circuits for measurements, communication, and/or power storage device (see example shown FIG. 15). Due to the energy loss by the discharged harvesting element and due to internal mechanical energy loss the oscillation amplitude will decay gradually. Next transition point will excite the inertial system again and the harvesting may continue practically without disruption through the entire cycle of the tire. FIG. 14 shows the decay of the vibrations of the output voltage of the harvester and a new excitation.

The electrical load connected to the harvester includes a rectification circuit, a voltage converter circuit, a voltage stabilization circuit and an energy storage device, e.g. a super capacitor.

Although a harvester operation as such is illustrated, it is not intended to limit the number of the harvesters in a tire to mere one only. Instead, according to embodiments, several harvesters can be operated in parallel in an embodied harvester bank or matrix, which can be mounted into the tire, as according to an embodiment even to follow the curvature of the tire for the mounting locations. Such modules comprising at least one harvester can be situated in an embodiment symmetrically so to balance the tire and/or provide more energy for the use.

Figure 15:
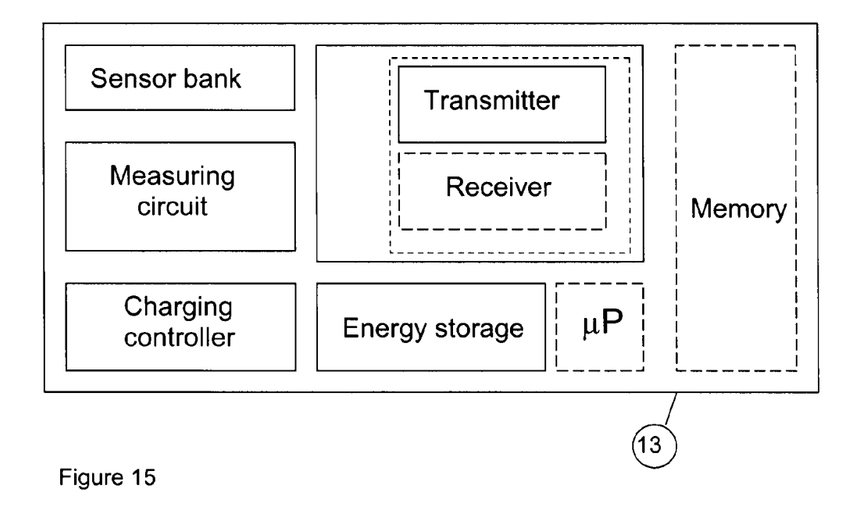
FIG. 15 illustrates electronics in an embodiment of the invention.

FIG. 15 illustrates electronics involved in an embodiment of the invention. Sensor bank comprises at least one sensor in an embodiment, but in an other embodiment an ensemble of sensors for measurements of the quantities in a tire. Quantities can be temperature and pressure, as well as acceleration and/or the tire position. Thus, an unbalanced tire can be detected, even before the vehicle driver would notice the unbalance. The sensors are read and/or communicated by the measuring electronics, that indicate in an embodiment when the sensors or certain of them in the bank are/is read. In an embodiment the measurement data so acquired is sent to the transmitter to be broadcasted outside of the tire. The dashed line around the receiver indicate optionality for such embodiment in which receiver is used to convey signals to the measuring circuit. Signals can be related for example to the reading command of the sensors, if used instead or in parallel of timed or intermittent reading or threshold or tolerance related reading for the measurement data to be acquired and to be broadcasted.

The dashed line surrounding the transmitter and receiver embody such embodiment wherein the two mentioned are integrated to form a transceiver. The radio block so indicated comprises according to an embodiment an impulse radio, which can be implemented in a known way as such. This way the energy savings are gained and the harvester power can be used for charging the battery in the charging controller control to deliver energy to the energy storage. In an optional embodiment there can be also microprocessor μP and/or memory available for the controlling of the operation of the electronics and/or store the measuring software and/or data in suitable part.

According to an embodiment the microprocessor and/or the memory can be powered via the energy source, when there is sufficiently energy available. The micro-processor can be also arranged to be waked up via the receiver, to perform the controlling and/or reporting duties of the electronic circuit, according to the purpose of it.

In an embodiment, at least one of the blocks indicated in FIG. 15 is provided with a dedicated harvester bank, so that at least one harvester in the bank is feeding said block. According to an embodiment several harvester banks can be attached into the tire. At least one of them can be arranged to feed the energy storage. According to an embodiment the banks form an in-tire-harvester system, referred also as harvester system in short. In an embodiment the system can comprise several harvesters arrange to operate with dedicated electronics parts. The system parts can be also diversified into the tire structure in an embodiment so to gain stability for the tire when rotating.

According to an embodiment at least one harvester (for example as in FIG. 12) is arranged to be in the harvester module, that is arranged to fit into the tire structures. According to an embodiment such a harvester module can (but does not necessarily) comprise several harvesters so forming into the module a harvester bank. The harvesters do not necessarily be implemented with the same operation embodiment. So there can be different deformation based pendulums as embodied as bending pendulum embodiment and/or torsion pendulum embodied harvesters, present even in a single bank.

According to an embodiment in which there are several modules mounted into the tire, they are mounted symmetrically into the tire embodied so to gain rotation balanced tire structure.

According to an embodiment of the invention the harvester can comprise transducer means (10), wherein in an alternative embodiment the transducer means can be diversified so that the transducer means comprise at least one stationary part and a dynamic part. According to an embodiment of the invention the stationary part can comprise magnet and/or coil, so that dynamic part then respectively comprises coil and/or magnet, arranged for electronic energy production as based on electromagnetic induction. According to an embodiment the dynamic part is configured to move along the beam and/or the inertial body, so that the magnetic force field of the responsible transducer part is capable for induce electromotive force in to a coil of the transducer means in the embodiment. According to an embodiment, the inertial body comprises the coil. According to an embodiment the coil is on the support as a printed board coil. According to an embodiment the inertial body comprises a magnet for the induction. According to an embodiment the same magnet is used as magnetic stopper, but is not necessary limited only there to. According to an alternative embodiment of the invention the dynamic part of the transducer can thus be so configured that the interaction of the beam (7,9) can be indirect, i.e. via the inertial body, for example, to provide respective movement between the stationary part and the dynamic part for induction.

In some embodiments the transducer means can comprise also a piezoelectric part in addition to the static and dynamic parts for induction. When in an embodiment they are isolated, the circuits they feed for energy can be used for different in certain sense independent purposes.

It is clear to the skilled person in the art from the shown embodiments of the invention that other translatory means such as conveyor belts and/or shoes or other foot wear can be excited in a similar way too.

REFERENCES

[1] U.S. Pat. No. 7,415,874
[2] U.S. Pat. No. 7,414,351

The invention claimed is:

1. A harvester, comprising;
   at least one inertial body;
   at least one beam;
   a support to said at least one beam; and
   a transducer means,
   wherein
      said at least one beam has a center axis in a length dimension of the beam, and configures the inertial body into a pendulum structure being suspended from said support so that the beam is allowed to deform according to the kinetic state changes of the inertial body,
      said at least one beam is configured to interact with at least one transducer means that is configured to produce change in the electrical state of said transducer means responsively to the kinetic state of the inertial body and/or to the deformed state of the beam,
      the harvester coverts energy from mechanical domain to electrical domain,
      the inertial body has at least three dimensions of which a length dimension of the inertial body in a pendulum plane of movement is aligned perpendicular to the center axis in the pendulum plane of the movement, and
      the length dimension of the inertial body is longer than the length dimension of the beam.

2. The harvester of claim 1, wherein said harvester comprises a torsion pendulum structure with said at least one beam for torsion deformation.

3. The harvester of claim 2, wherein said harvester comprises two beams, the center axes of the two beams configured to form a torsion axis of the torsion pendulum through their intermediate inertial body, each beam being suspended to the support at its own opposite side.

4. The harvester of claim 1, wherein at least one of the beams is configured to operate as a bending spring and/or as a torsion spring in the pendulum structure.

5. The harvester of claim 1, wherein the length dimension of said at least one beam is shorter than the length dimension of the inertial body.

6. The harvester of claim 1, wherein the support comprises a leading configuration to lead electricity through a layer of the support.

7. The harvester of claim 6, wherein said leading configuration to lead electricity through a layer of the support comprises a galvanic lead through the support and/or a capacitor of the galvanic lead, and at least one electrode is connected to the transducer.

8. The harvester of claim 1, wherein the harvester further comprises at least one of the following:
   a module housing;
   an attachment means to translatory means;
   at least one overload stopper;
   a contact electrode for galvanic contact;
   an electrical component, a receiver and/or a transmitter circuit;
   an energy storage for produced electricity; and
   a transducer part further comprising a magnet, a coil, and/or a piezoelectric layer.

9. The harvester of claim 1, wherein said transducer means comprises a piezoelectric element configured electrically responsive for bending of at least one of said beams.

10. The harvester of claim 9, wherein the piezoelectric element comprises a piezoelectric layer on at least one surface of at least one of said beams.

11. The harvester of claim 1, wherein at least one of said beams is lengthwise aligned in a radial direction for mounting into a tire.

12. The harvester of claim 1, wherein an end of the said at least one beam connected to the inertial body is farther from a center of rotation of a tire than an end of said at least one beam connected to the support.

13. The harvester of claim 1, wherein the transducer means comprises at least one coil and at least one permanent magnet adapted for electromagnetic induction to occur when the distance and/or the angle between the magnet and the coil changes according to the inertial body movement in respect to the support.

14. The harvester of claim 13, wherein the transducer means comprises at least one coil in the inertial body and the support has at least one permanent magnet.

15. The harvester of claim 13, wherein the transducer means comprises at least one coil at the support and the inertial body has at least one permanent magnet.

16. A harvester matrix, comprising at least one harvester of claim 1.

17. A harvester matrix system, comprising at least one harvester matrix of claim 16.

18. A harvester module, comprising at least one harvester according to claim 1.

19. The harvester module of claim 18, comprising an attachment structure to the inner liner of a translatory means.

20. The harvester module of claim 19, wherein said translatory means comprises a tire, wheel, conveyor belt or a foot-ware.

21. A tire, comprising at least one harvester of claim 1.

22. The tire of claim 21, further comprising:
   a connecting means to connect a harvester-connected transmitter to a metallic part of the tire as an antenna.

23. A foot-ware, comprising the harvester module of claim 18.

24. The harvester of claim 1, wherein the at least one inertial body has even mass distribution.

25. The harvester of claim 1, wherein the at least one inertial body has length-wise taken more mass located at the ends than at the middle.

26. The harvester of claim 1, wherein the harvester further comprises a circuit configured to form a transceiver that is operable in accordance with an impulse radio-standard.

27. The harvester of claim 1, further comprising at least one overload stopper comprising a pair of magnets adapted for a stopping function through magnetic repulsion for avoidance of direct contact of the magnetic surfaces of the stopper.

28. The harvester of claim 1, further comprising at least one overload stopper on the inertial body.

29. The harvester of claim 1, wherein the length dimension of the inertial body is at least 1.5 times the length dimension of the at least one beam, the length dimension of the at least one beam measured between a suspension point to the support and to the inertial body.

30. The harvester of claim 5, wherein the length dimension of the at least one beam is at most 0.66 times the length dimension of the inertial body, the length dimension of said at least one beam measured between a suspension point to the support and to the inertial body.

31. A tire, comprising a connecting means to connect a harvester-connected transmitter to a metallic part of the tire as an antenna, wherein the harvester-connected transmitter comprises the harvester of claim 1.

\* \* \* \* \*